(12) United States Patent
Ginzburg

(10) Patent No.: US 11,063,407 B1
(45) Date of Patent: Jul. 13, 2021

(54) ADDRESSABLE VERTICAL CAVITY SURFACE EMITTING LASER ARRAY FOR GENERATING STRUCTURED LIGHT PATTERNS

(71) Applicant: Facebook Technologies, LLC, Menlo Park, CA (US)

(72) Inventor: Jonatan Ginzburg, Sunnyvale, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/521,480

(22) Filed: Jul. 24, 2019

Related U.S. Application Data

(60) Provisional application No. 62/835,965, filed on Apr. 18, 2019.

(51) Int. Cl.
| | | |
|---|---|---|
| *H01S 5/00* | (2006.01) | |
| *H01S 5/42* | (2006.01) | |
| *H01S 5/40* | (2006.01) | |
| *H01S 5/062* | (2006.01) | |
| *G02B 27/01* | (2006.01) | |

(Continued)

(52) U.S. Cl.
CPC .......... *H01S 5/423* (2013.01); *H01S 5/0624* (2013.01); *H01S 5/06233* (2013.01); *H01S 5/06236* (2013.01); *H01S 5/06243* (2013.01); *H01S 5/4025* (2013.01); *H01S 5/4081* (2013.01); *H01S 5/4087* (2013.01); *G01B 11/2513* (2013.01); *G02B 27/0172* (2013.01); *G02C 5/008* (2013.01)

(58) Field of Classification Search
CPC ...... H01S 5/423; H01S 5/4087; H01S 5/4081; H01S 5/4025; H01S 5/06233; H01S 5/06236; H01S 5/0624; H01S 5/06243
See application file for complete search history.

(56) References Cited

U.S. PATENT DOCUMENTS 10,497,295 B1 * 12/2019 Jia ........................... G06F 3/011
10,509,128 B1 * 12/2019 Lee ......................... G01S 17/42
(Continued)

FOREIGN PATENT DOCUMENTS

| EP | 2827175 A2 | 1/2015 |
| EP | 3282285 A1 | 2/2018 |

(Continued)

OTHER PUBLICATIONS

PCT International Search Report and Written Opinion, PCT Application No. PCT/US2020/027753, dated Sep. 11, 2020, 13 pages.

*Primary Examiner* — Kinam Park
(74) *Attorney, Agent, or Firm* — Fenwick & West LLP

(57) ABSTRACT

An addressable vertical cavity surface emitting laser (VCSEL) array may generate structured light in dot patterns. The VCSEL array includes a plurality of traces that control different groups of VCSELs, such that each group of VCSELs may be individually controlled. The VCSEL groups are arranged such that they emit a dot pattern, and by modulating which groups of VCSELs are active a density of the dot pattern may be adjusted. The VCSEL array may be part of a depth projector that projects the dot pattern into a local area. A projection assembly may replicate the dot pattern in multiple tiles.

20 Claims, 10 Drawing Sheets

(51) Int. Cl.
  *G02C 5/00*    (2006.01)
  *G01B 11/25*   (2006.01)

(56)     References Cited

U.S. PATENT DOCUMENTS

| 10,645,520 | B1* | 5/2020 | Amengual Gari ........................... |
| | | | G10L 21/0232 |
| 10,715,909 | B1* | 7/2020 | Tourbabin ................ G10L 25/18 |
| 2014/0376092 | A1* | 12/2014 | Mor ........................ H01S 5/423 |
| | | | 359/569 |
| 2015/0260830 | A1* | 9/2015 | Ghosh ..................... G01S 17/04 |
| | | | 250/208.1 |
| 2017/0195653 | A1* | 7/2017 | Trail .................... H04N 13/344 |
| 2018/0048880 | A1* | 2/2018 | Trail ..................... G06F 3/0304 |
| 2020/0251886 | A1* | 8/2020 | Kuo ................... G02B 27/4205 |

FOREIGN PATENT DOCUMENTS

| WO | WO 2019/040506 A1 | 2/2019 |
| WO | WO 2020/050777 A1 | 3/2020 |

\* cited by examiner

500

---

Select a first dot pattern, of a plurality of dot patterns, based in part on a target density and a target distance, wherein the first dot pattern is associated with a subset of traces of a plurality of traces on a chip, and each respective trace is conductively coupled to a respective group of VCSELs on the chip
510

↓

Activate at least one group of VCSELs that are conductively coupled via the first subset of traces, such that the activated at least one group of VCSELs emit light that forms a first dot pattern
520

↓

Project the first dot pattern into the local area, wherein the first dot pattern has the target density at the target distance
530

FIG. 5

ADDRESSABLE VERTICAL CAVITY SURFACE EMITTING LASER ARRAY FOR GENERATING STRUCTURED LIGHT PATTERNS

CROSS-REFERENCE TO RELATED APPLICATIONS

This application claims the benefit of U.S. Provisional Application No. 62/835,965, filed on Apr. 18, 2019, which is incorporated by reference in its entirety.

FIELD OF ART

This disclosure relates generally to generating structured light patterns, and more specifically to an addressable vertical cavity surface emitting laser (VCSEL) array for generating structured light patterns.

BACKGROUND

Very generally, structured light sensing is the process of projecting a known structured light pattern (e.g., bars) onto a scene using a structured light projector. Depth information of the scene may be calculated using images of the scene illuminated with the structured light pattern. Effectiveness of the structured light pattern is based in part on a density of the pattern features. Conventional structured light projectors typically have a fixed pattern that is not dynamically adjusted. Accordingly, conventional structured light projectors typically are optimized for a particular range of distances—but outside of those distances the pattern either becomes too dense (e.g., such that the features are not resolvable from each other) or too sparse (e.g., leads to very low resolution).

SUMMARY

An addressable vertical cavity surface emitting laser (VCSEL) array configured to generate a plurality of different dot patterns. In some embodiments, the dot patterns are directly projected into a local area to form a structured light pattern. In other embodiments, one or more of the dot patterns are tiled throughout the local area to form the structured light pattern. The VCSEL array includes a plurality of conductive traces that control different groups of VCSELs, such that each group of VCSELs may be individually controlled. The VCSEL groups are configured to emit a respective dot pattern. By modulating which groups of VCSELs are active different dot patterns may be emitted. For example, one set of one or more VCSEL groups may emit a dot pattern that has a first dot density, and a different set of one or more VCSEL groups may emit a dot pattern of a second dot density that is different than the first dot density. The VCSEL array may be formed such that the conductive traces are all in the same plane and do not overlap. In some embodiments, one or more of the conductive traces may be in different planes and pass over and/or under one or more other conductive traces. In some embodiments, the VCSELs in different groups may emit light at different wavelengths. The VCSEL array may be part of a depth projector that projects the dot pattern into a local area.

In some embodiments, a vertical cavity surface emitting laser (VCSEL) array may comprise: a plurality of groups of VCSELs on a single VCSEL chip, where each group of VCSELs forms a different dot pattern; and a plurality of traces, where each trace conductively couples to a respective group of VCSELs such that each group of VCSELs is individually addressable.

In some embodiments, a structured light projector may comprise: a first group of emitters conductively coupled to a first trace; and a second group of emitters conductively coupled to a second trace, wherein the first group of emitters and the second group of emitters are individually addressable.

In some embodiments, a method may comprise: selecting a first dot pattern, of a plurality of dot patterns, based in part on a target density and a target distance, wherein the first dot pattern is associated with a subset of traces of a plurality of traces on a chip, and each respective trace is conductively coupled to a respective group of VCSELs on the chip; activating at least one group of VCSELs that are conductively coupled via the first subset of traces, such that the activated at least one group of VCSELs emit light that forms a first dot pattern; and projecting the first dot pattern into the local area, wherein the first dot pattern has the target density at the target distance.

BRIEF DESCRIPTION OF THE DRAWINGS

FIG. 5 is a flowchart illustrating a process for generating a structured light pattern, in accordance with one or more embodiments.

Figure 1A:
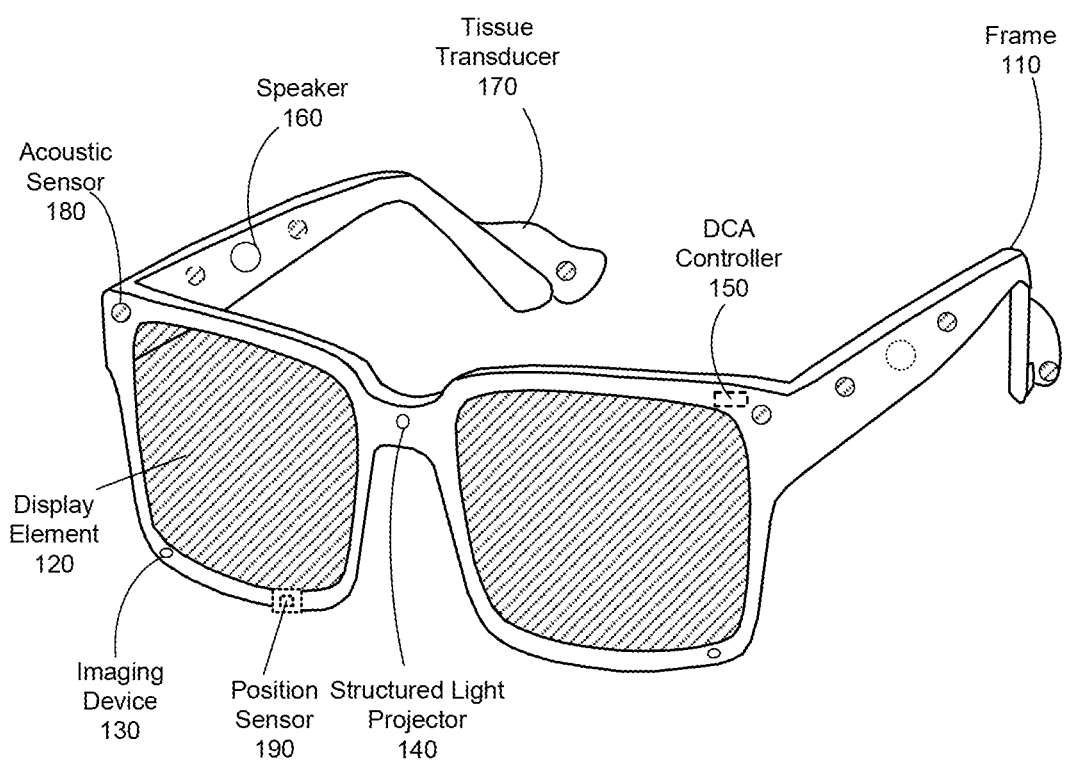
FIG. 1A is a perspective view of a headset implemented as an eyewear device, in accordance with one or more embodiments.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

A VCSEL array is configured to generate a plurality of different dot patterns. The VCSEL array may be part of a structured light projector of a depth camera assembly (e.g., for a headset). The VCSEL array includes a plurality of groups of emitters. Each group of emitters may comprise multiple discrete VCSELs which each generate a beam of light (e.g., near-infrared light). Each group of emitters may be independently controlled (e.g., by a depth camera assembly). Controlling a group of emitters may comprise instructing emitters in the group to emit light, instructing emitters in the group not to emit light, varying an intensity of light emitted from the emitters in the group, varying a wavelength of the light emitted by the emitters in the group, varying a temperature of the emitters in the group, or some combination thereof. For example, near field depth sensing (relative to far field) may use a relatively less dense dot pattern, and some emitters may be inactivated. In contrast, far field depth sensing may use a relatively denser dot pattern, and more emitters may be activated.

The addressable groups of emitters allow for a greater variety of dot patterns to be dynamically generated compared to conventional systems. Any desired dot density may be achieved through trace pattern design and selective activation of groups of emitters. Additionally, power input is proportional to the dot density. Thus, using a single VCSEL array, a depth camera assembly may select a less dense dot pattern for a near range application to save power. Subsequently, the depth camera assembly may adjust the dot density for a far range application by increasing the dot pattern density.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to create content in an artificial reality and/or are otherwise used in an artificial reality. The artificial reality system that provides the artificial reality content may be implemented on various platforms, including a wearable device (e.g., headset) connected to a host computer system, a standalone wearable device (e.g., headset), a mobile device or computing system, or any other hardware platform capable of providing artificial reality content to one or more viewers.

FIG. 1A is a perspective view of a headset 100 implemented as an eyewear device, in accordance with one or more embodiments. In some embodiments, the eyewear device is a near eye display (NED). In general, the headset 100 may be worn on the face of a user such that content (e.g., media content) is presented using a display assembly and/or an audio system. However, the headset 100 may also be used such that media content is presented to a user in a different manner. Examples of media content presented by the headset 100 include one or more images, video, audio, or some combination thereof. The headset 100 includes a frame, and may include, among other components, a display assembly including one or more display elements 120, a depth camera assembly (DCA), an audio system, and a position sensor 190. While FIG. 1A illustrates the components of the headset 100 in example locations on the headset 100, the components may be located elsewhere on the headset 100, on a peripheral device paired with the headset 100, or some combination thereof. Similarly, there may be more or fewer components on the headset 100 than what is shown in FIG. 1A.

The frame 110 holds the other components of the headset 100. The frame 110 includes a front part that holds the one or more display elements 120 and end pieces (e.g., temples) to attach to a head of the user. The front part of the frame 110 bridges the top of a nose of the user. The length of the end pieces may be adjustable (e.g., adjustable temple length) to fit different users. The end pieces may also include a portion that curls behind the ear of the user (e.g., temple tip, ear piece).

The one or more display elements 120 provide light to a user wearing the headset 100. As illustrated the headset includes a display element 120 for each eye of a user. In some embodiments, a display element 120 generates image light that is provided to an eyebox of the headset 100. The eyebox is a location in space that an eye of user occupies while wearing the headset 100. For example, a display element 120 may be a waveguide display. A waveguide display includes a light source (e.g., a two-dimensional source, one or more line sources, one or more point sources, etc.) and one or more waveguides. Light from the light source is in-coupled into the one or more waveguides which outputs the light in a manner such that there is pupil replication in an eyebox of the headset 100. In-coupling and/or outcoupling of light from the one or more waveguides may be done using one or more diffraction gratings. In some embodiments, the waveguide display includes a scanning element (e.g., waveguide, mirror, etc.) that scans light from the light source as it is in-coupled into the one or more waveguides. Note that in some embodiments, one or both of the display elements 120 are opaque and do not transmit light from a local area around the headset 100. The local area is the area surrounding the headset 100. For example, the local area may be a room that a user wearing the headset 100 is inside, or the user wearing the headset 100 may be outside and the local area is an outside area. In this context, the headset 100 generates VR content. Alternatively, in some embodiments, one or both of the display elements 120 are at least partially transparent, such that light from the local area may be combined with light from the one or more display elements to produce AR and/or MR content.

In some embodiments, a display element 120 does not generate image light, and instead is a lens that transmits light from the local area to the eyebox. For example, one or both of the display elements 120 may be a lens without correction (non-prescription) or a prescription lens (e.g., single vision, bifocal and trifocal, or progressive) to help correct for defects in a user's eyesight. In some embodiments, the display element 120 may be polarized and/or tinted to protect the user's eyes from the sun.

Note that in some embodiments, the display element 120 may include an additional optics block (not shown). The optics block may include one or more optical elements (e.g., lens, Fresnel lens, etc.) that direct light from the display element 120 to the eyebox. The optics block may, e.g., correct for aberrations in some or all of the image content, magnify some or all of the image, or some combination thereof.

The DCA determines depth information for a portion of a local area surrounding the headset 100. The DCA includes one or more imaging devices 130, a structured light projector 140, and a DCA controller 150. In some embodiments, the structured light projector 140 illuminates a portion of the local area with light. The light may be, e.g., structured light (e.g., dot pattern, bars, etc.) in the infrared (IR), IR flash for time-of-flight, etc. In some embodiments, the one or more imaging devices 130 capture images of the portion of the local area that include the light from the structured light projector 140. As illustrated, FIG. 1A shows a single structured light projector 140 and two imaging devices 130. In alternate embodiments, there is no structured light projector 140 and at least two imaging devices 130.

The structured light projector 140 comprises at least one VCSEL chip. A VCSEL emits a plurality of different dot patterns. The VCSEL chip includes a plurality of traces. A trace includes a plurality of emitters that have an arrangement on the VCSEL chip (such as sinusoidal arrangement, a pseudo random arrangement, etc.). The arrangement is such that when a trace is active, the plurality of emitters emit a dot pattern that has a spatial distribution that corresponds to the arrangement of the plurality of emitters. In some embodiments, the arrangement may be the same for different traces. Alternatively, the arrangement may be different between at least one trace and one other trace on the VCSEL chip. In some embodiments, the arrangement is different for each of the traces. Each emitter may emit a beam of light resulting in a dot. The particular arrangement is such that light emitted from the plurality of emitters for a trace forms a corresponding dot pattern in the local area. Each trace may be individually addressable. Thus, different dot patterns may be generating by activating different traces on the VCSEL chip. In circumstances where a high-density dot pattern is desirable, such as for depth-sensing at long ranges, the DCA controller 150 may activate all traces on the VCSEL chip. In circumstances where a low-density dot pattern is desirable, such as for depth sensing at short ranges, the DCA controller 150 may activate a subset of the traces on the VCSEL chip. The VCSEL chips and their operation are discussed in greater detail with respect to FIG. 2-FIG. 5.

The DCA controller 150 computes depth information for the portion of the local area using the captured images and one or more depth determination techniques. The depth determination technique may be, e.g., direct time-of-flight (ToF) depth sensing, indirect ToF depth sensing, structured light, passive stereo analysis, active stereo analysis (uses texture added to the scene by light from the structured light projector 140), some other technique to determine depth of a scene, or some combination thereof.

The audio system provides audio content. The audio system includes a transducer array, a sensor array, and an audio controller. However, in other embodiments, the audio system may include different and/or additional components. Similarly, in some cases, functionality described with reference to the components of the audio system can be distributed among the components in a different manner than is described here. For example, some or all of the functions of the controller may be performed by a remote server.

The transducer array presents sound to user. The transducer array includes a plurality of transducers. A transducer may be a speaker 160 or a tissue transducer 170 (e.g., a bone conduction transducer or a cartilage conduction transducer).

The sensor array detects sounds within the local area of the headset 100. The sensor array includes a plurality of acoustic sensors 180. An acoustic sensor 180 captures sounds emitted from one or more sound sources in the local area (e.g., a room). Each acoustic sensor is configured to detect sound and convert the detected sound into an electronic format (analog or digital). The acoustic sensors 180 may be acoustic wave sensors, microphones, sound transducers, or similar sensors that are suitable for detecting sounds.

The audio controller (not shown in FIG. 1A) processes information from the sensor array that describes sounds detected by the sensor array. The audio controller may comprise a processor and a computer-readable storage medium. The audio controller may be configured to generate direction of arrival (DOA) estimates, generate acoustic transfer functions (e.g., array transfer functions and/or head-related transfer functions), track the location of sound sources, form beams in the direction of sound sources, classify sound sources, generate sound filters for the speakers 160, or some combination thereof.

The position sensor 190 generates one or more measurement signals in response to motion of the headset 100. The position sensor 190 may be located on a portion of the frame 110 of the headset 100. The position sensor 190 may include an inertial measurement unit (IMU). Examples of position sensor 190 include: one or more accelerometers, one or more gyroscopes, one or more magnetometers, another suitable type of sensor that detects motion, a type of sensor used for error correction of the IMU, or some combination thereof. The position sensor 190 may be located external to the IMU, internal to the IMU, or some combination thereof.

In some embodiments, the headset 100 may provide for simultaneous localization and mapping (SLAM) for a position of the headset 100 and updating of a model of the local area. For example, the headset 100 may include a passive camera assembly (PCA) that generates color image data. The PCA may include one or more RGB cameras that capture images of some or all of the local area. In some embodiments, some or all of the imaging devices 130 of the DCA may also function as the PCA. The images captured by the PCA and the depth information determined by the DCA may be used to determine parameters of the local area, generate a model of the local area, update a model of the local area, or some combination thereof. Furthermore, the position sensor 190 tracks the position (e.g., location and pose) of the headset 100 within the room. Additional details regarding the components of the headset 100 are discussed below in connection with FIG. 6.

Figure 1B:
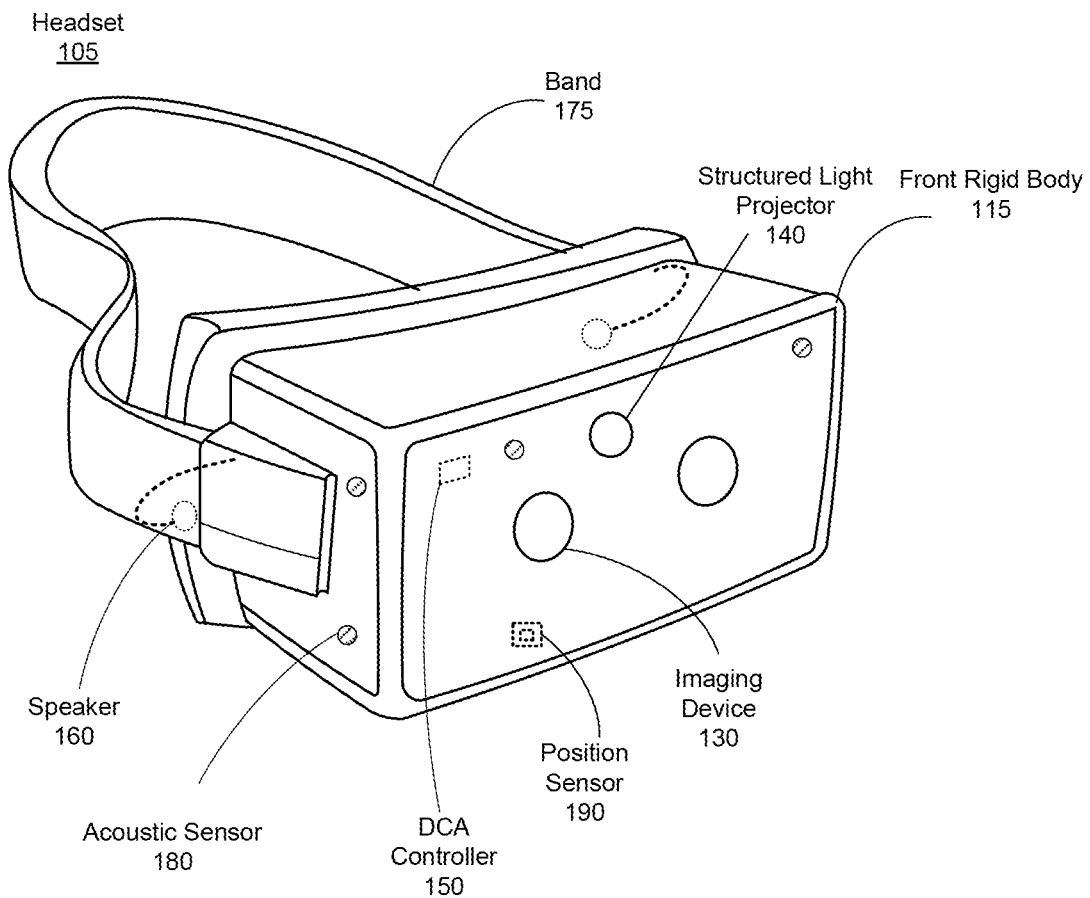
FIG. 1B is a perspective view of a headset implemented as a head-mounted display, in accordance with one or more embodiments.

FIG. 1B is a perspective view of a headset 105 implemented as a HMD, in accordance with one or more embodiments. In embodiments that describe an AR system and/or a MR system, portions of a front side of the HMD are at least partially transparent in the visible band (~380 nm to 750 nm), and portions of the HMD that are between the front side of the HMD and an eye of the user are at least partially transparent (e.g., a partially transparent electronic display). The HMD includes a front rigid body 115 and a band 175. The headset 105 includes many of the same components described above with reference to FIG. 1A, but modified to integrate with the HMD form factor. For example, the HMD includes a display assembly, a DCA, an audio system, and a position sensor 190. FIG. 1B shows the structured light projector 140, a plurality of the speakers 160, a plurality of the imaging devices 130, a plurality of acoustic sensors 180, and the position sensor 190.

Figure 2:
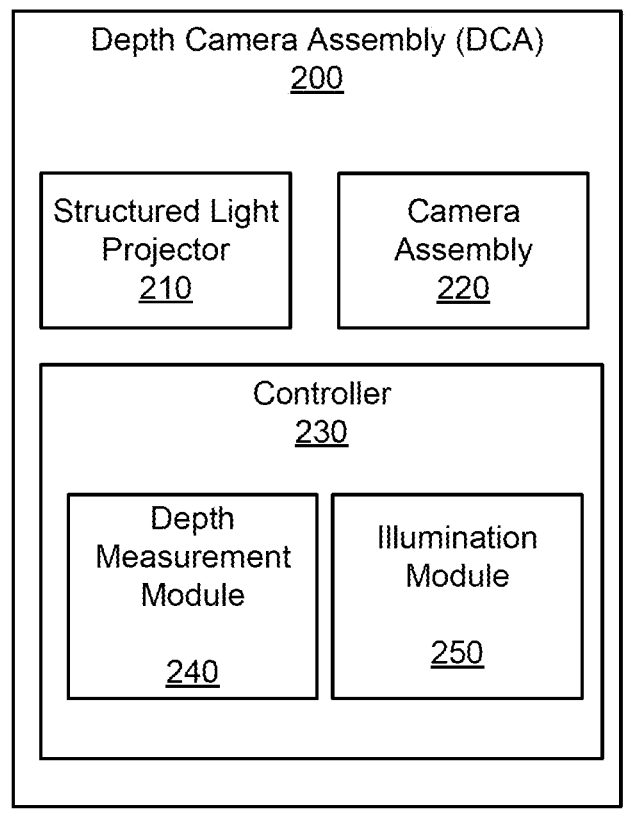
FIG. 2 is a block diagram of a depth camera assembly, in accordance with one or more embodiments.

FIG. 2 is a block diagram of a DCA 200 for a headset, in accordance with one or more embodiments. In some embodiments, the DCA 200 may be the DCA described with respect to FIG. 1A and FIG. 1B. Some embodiments of the DCA 200 have different components than those described here. Similarly, the functions can be distributed among the components in a different manner than is described here. In some embodiments, some of the functions of the DCA 200 may be part of different components (e.g., some may be part of the headset and some maybe part of a console and/or server).

The DCA 200 generates depth information of a local area, such as a room. Depth information includes pixel values defining distance from the DCA 200, providing a mapping of locations captured in the depth information, such as a three-dimensional mapping of locations captured in the depth information. The DCA 200 includes a structured light projector 210, a camera assembly 220, and a controller 230.

The structured light projector 210 generates structured light and projects the structured light into the local area. The structured light projector 140 of FIG. 1A may be an embodiment of the structured light projector 210. The structured light projector 210 comprises one or more illumination sources, an optical assembly, and a projection assembly. An illumination source is configured to emit light (e.g., as an optical beam), and may emit multiple wavelengths of light. The illumination source may emit light in, e.g., a visible band (~380 nm to 750 nm), in an infrared (IR) band (~750 nm to 1,800 nm), in an ultraviolet band (~100 nm to 380 nm), some other portion of the electromagnetic spectrum that the camera assembly 220 is configured to detect, or some combination thereof. Light emitted from the one or more of the illumination sources may be, e.g., polarized (e.g., linear, circular, etc.).

The illumination source may comprise a vertical-cavity surface-emitting laser (VCSEL) chip. The VCSEL chip may comprise a plurality of traces. Each trace may comprise a plurality of emitters that have an arrangement on the VCSEL chip (such as sinusoidal arrangement, a pseudo random arrangement, etc.). In some embodiments, one or more traces on the VCSEL chip may overlap. The arrangement is such that when a trace is active, the plurality of emitters emit a dot pattern that has a spatial distribution that corresponds to the arrangement of the plurality of emitters. Each emitter may emit a beam of light resulting in a dot. The emitters may emit light of different wavelengths or polarizations. Each trace may be individually addressable. Thus, different dot patterns may be generating by activating different traces on the VCSEL chip. In circumstances where a high-density dot pattern is desirable, such as for depth-sensing at long ranges, the DCA controller 150 may activate all traces on the VCSEL chip. In circumstances where a low-density dot pattern is desirable, such as for depth sensing at short ranges, the DCA controller 150 may activate a subset of the traces on the VCSEL chip.

In some embodiments, the emitter arrangement may be the same for different traces. Alternatively, the arrangement may be different between at least one trace and one other trace on the VCSEL chip. In some embodiments, the arrangement is different for each of the traces. In this manner, the VCSEL chip can emit dot patterns of variable density, where density of the emitted dot pattern increases with a number of traces that are activated. In some embodiments, each emitter may be controlled by its own trace. Thus, each emitter on the VCSEL chip could be individually controlled. The VCSEL chips and their operation are discussed in additional detail with respect to FIG. 3-FIG. 5.

The projection assembly projects one or more structured light patterns into the local area. The conditioned one or more dot patterns form a corresponding structured light pattern that the projection assembly projects into the local area. Each trace may emit a particular dot pattern. The combination of active dot patterns combines to form a corresponding structured light pattern in the local area. With different active groups of emitters, the projection assembly projects different structured light patterns. The projection assembly comprises one or more optical elements that direct the structured light pattern into the local area. For example, the projection assembly could comprise a plurality of lenses. In some embodiments, the projection assembly includes a beam shaping element that changes a profile, or general intensity envelope, of the structured light. The structured light pattern includes a plurality of structured light elements. Each element is a discrete portion of the structured light pattern, such as a dot.

The projection assembly generates a plurality of tiles using the conditioned light (dot pattern emitted by the VCSEL array) and projects the tiles throughout the local area to form a structured light pattern. The projection assembly may comprise one or more optical elements, such as diffractive optical elements (e.g., 1D and/or 2D gratings), scanning mirrors (e.g., MEMS mirror), lenses, mirrors, or some combination thereof.

In some embodiments, all of the tiles generated by the projection assembly have the same dot pattern. In other embodiments, the projection assembly may generate one or more tiles that have a dot pattern that is different from at least one other tile. For example, the VCSEL chip may generate a first dot pattern that is projected into a particular portion of the local area using a scanning mirror, and then produce a second dot pattern that is projected into a different portion of the local area using a scanning mirror.

The structured light projector 210 may vary the structured light pattern in accordance with illumination instructions from the controller 230. In some embodiments, the structured light projector 210 may project the same pattern over the entire field of view of the structured light projector 210, or the structured light projector 210 may project different structured light patterns to different portions of the field of view. For example, the structured light pattern may be formed from a plurality of tiles that are each projected into a respective portion of the field of view of the structured light projector 210. The plurality of tiles together form an entire structured light pattern. In some embodiments, each tile of the structured light pattern may contain a different structured light pattern and may be individually adjusted. For example, in response to a change in condition at a given instant in time, the structured light projector 210 may increase the intensity of the structured light pattern in a first tile, such as by activating a trace or by increasing the current driven through a trace, and the structured light projector 210 may simultaneously decrease the intensity of the structured light pattern in a second tile, such as by deactivating a trace or decreasing the current driven through the trace. For each portion of the field of view of the structured light projector 210, the structured light projector 210 may adjust any suitable property of the structured light pattern, such as the intensity, density, pattern shape (e.g., dots, grids), polarization, blink rate, etc. In some embodiments, the structured light pattern may be time multiplexed, such that different patterns are projected into different portions of the field of view at different times.

The structured light projector 210 may vary the structured light pattern by having different groups of emitters be active and/or having some or all of the emitters be tunable. In some embodiments, the structured light pattern is controlled by controlling each emitter individually or by group or section, in which the dynamic properties are manifested in the projected pattern in terms of pattern shape, intensity, polarization, temporal modulation, field of view, etc. In some embodiments, the combination of using an addressable light source and tunable optics may be adopted to realize dynamic light patterns with considerations in projector size, weight, power, cost, etc.

Different VCSEL chips may be designed for specific applications. In some embodiments, the structured light projector 210 may apply different currents or pulse durations to different traces to make a structured light pattern with multiple dot intensity levels. This may make the dot constellation detection algorithm less complicated, which may reduce a computation power requirement. Additionally, by placing emitters on narrow curved traces, the layout allows uniform coverage of dot emitters across a VCSEL chip.

The camera assembly 220 is configured to capture images of the local area. The camera assembly 220 includes one or more imaging devices (e.g., a camera) that can capture images in at least a band of the structured light pattern, such as in the infrared band. The imaging devices 130 of FIG. 1A may be an embodiment of the camera assembly 220. In some embodiments, the one or more imaging devices and/or other imaging devices of the camera assembly 220 may also capture light in a visible optical band. In some instances, some or all of the captured images of the local area may include some or all of the structured light pattern (e.g., reflected by objects in the local area).

The controller 230 controls the components of the DCA 200. The controller may comprise an illumination module 250 and a depth measurement module 240. Some embodiments of the controller 230 have different components than those described here. Similarly, the functions can be distributed among the components in a different manner than is described here. In some embodiments, some of the functions of the controller 230 may be part of different components (e.g., some may be part of the headset and some maybe part of a console and/or server).

The illumination module 250 may generate illumination instructions to provide to the structured light projector 210 to project a structured light pattern. The illumination instructions may reduce (and in some cases minimize) power consumption of the structured light projector 210 while providing sufficient texture in the local area to calculate depth information. In some embodiments, the illumination module 250 may determine that the local area contains sufficient texture based on a confidence level of depth measurements (e.g., texture may be sufficient if depth measurements are calculated with a confidence level of greater than 95%, or greater than 50%).

In some embodiments, the illumination instructions may cause the structured light projector to activate or deactivate groups of emitters based on a distance to an object. For example, in response to a known or measured distance to an object that is less than a threshold distance, such as less than 3 feet, or less than 10 feet, the illumination instructions may cause the structured light projector 210 to deactivate at least one group of emitters, or a percentage of the groups of emitters, such as 50% of the groups of emitters. In response to a known or measured distance to an object that is greater than the threshold distance, the illumination instructions may instruct the structured light projector 210 to activate all of the groups of emitters, or a percentage of the groups of emitters, such as at least 75% of the groups of emitters. In some embodiments, different numbers or combinations of the groups of emitters may be activated based on different distances to objects.

The depth measurement module 240 determines depth information for each pixel of an image based on images captured by the camera assembly 220 and stores the depth information for each pixel in association with the pixel to generate the depth image. The depth measurement module analyzes the images containing the structured light pattern. Distortions in the structured light pattern by three-dimensional objects in the local area allow the DCA to calculate three-dimensional depth information. In some embodiments, the depth measurement module uses known methods to calculate depth information, such as active stereo, time-of-flight, etc.

Figure 3A:
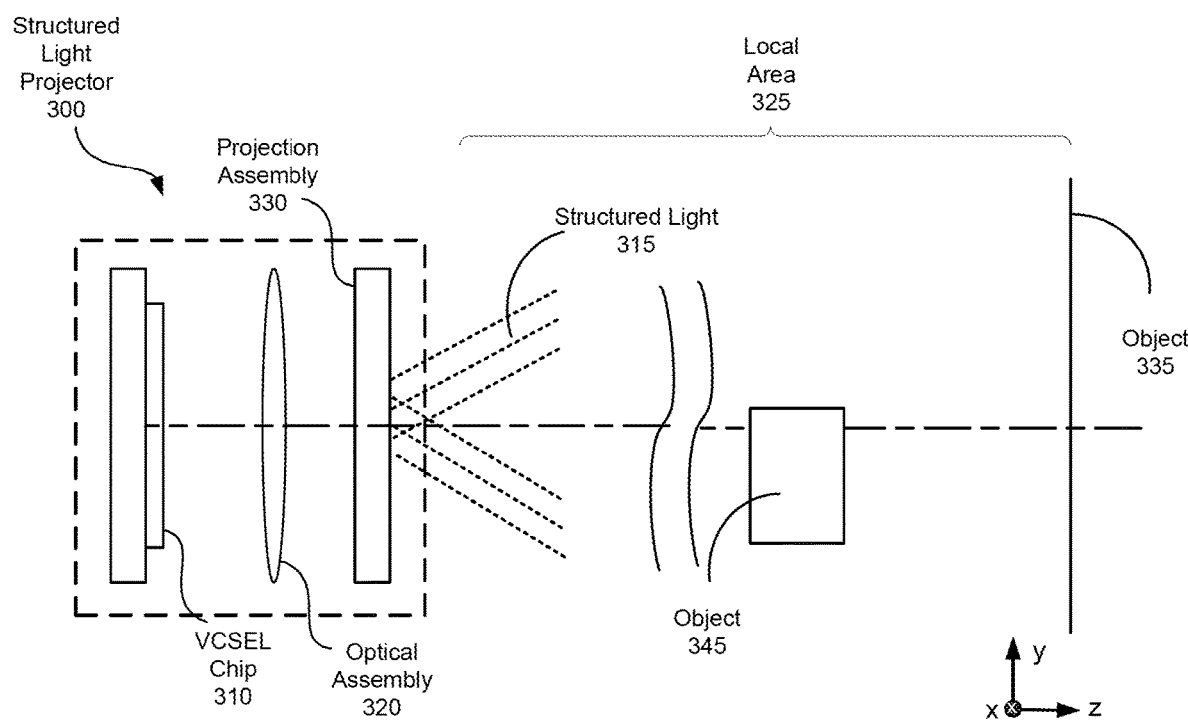
FIG. 3A is a schematic side view of a structured light projector, in accordance with one or more embodiments.

FIG. 3A is an example schematic side view of a structured light projector 300 according to one or more embodiments. In some embodiments, the structured light projector 300 may be an embodiment of the structured light projector 210 of FIG. 2. The structured light projector 300 may comprise at least one VCSEL chip 310 and an optical assembly 320. The VCSEL chip 310 is an embodiment of the VCSEL array and/or VCSEL chip described above. Note, while a single VCSEL chip 310 is shown, in other embodiments, multiple VCSEL chips may part of the structured light projector 300. In some embodiments, the structured light projector 300 may also include a projection assembly 330. The structured light projector 300 generates and projects a structured light pattern, of a plurality of structured light patterns, in accordance with instructions from a depth camera assembly (not shown), such as the depth camera assembly 200 of FIG. 2.

The structured light projector 300 projects structured light 315 into a local area 325. The local area 325 may include one or more objects, such as object 335 and object 345. The object 335 and the object 345 may be located at different distances to the structured light projector 300. Based on the different distances, the structured light projector 300 may select different structure light densities or patterns to illuminate the object 335 and the object 345. For example, the structured light projector 300 may select a denser pattern in the area of object 335, and a relatively less dense pattern in the area of object 345.

The optical assembly 320 conditions light from the VCSEL chip 310 of FIG. 3A. Conditioning light may include, e.g., collimating light from the VCSEL chip 310, error and/or aberration correction, beam expansion, projection, or some combination thereof. The optical assembly 320 may comprise one or more lenses, mirrors, or other components configured to condition light from the VCSEL chip 310. In some embodiments, there is no beam multiplication DOE and the optical assembly 320 projects the conditioned light directly into the local area. In this case the conditioned dot pattern is the structured light pattern. In some embodiments the optical assembly may comprise a beam combiner that combines beams from different VCSEL chips to further increase pattern density. For example, different VCSELs may emit light at different wavelengths, which may be combined using a dichroic mirror.

In some embodiments, the structured light projector 300 may also include a projection assembly 330. The projection assembly 330 generates a plurality of tiles 340 using the conditioned light (dot pattern emitted by the VCSEL array) and projects the tiles throughout the local area to form a structured light pattern. The projection assembly 330 may comprise one or more optical elements, such as diffractive optical elements (e.g., 1D and/or 2D gratings), scanning mirrors (e.g., MEMS mirror), lenses, mirrors, or some combination thereof.

Figure 3B:
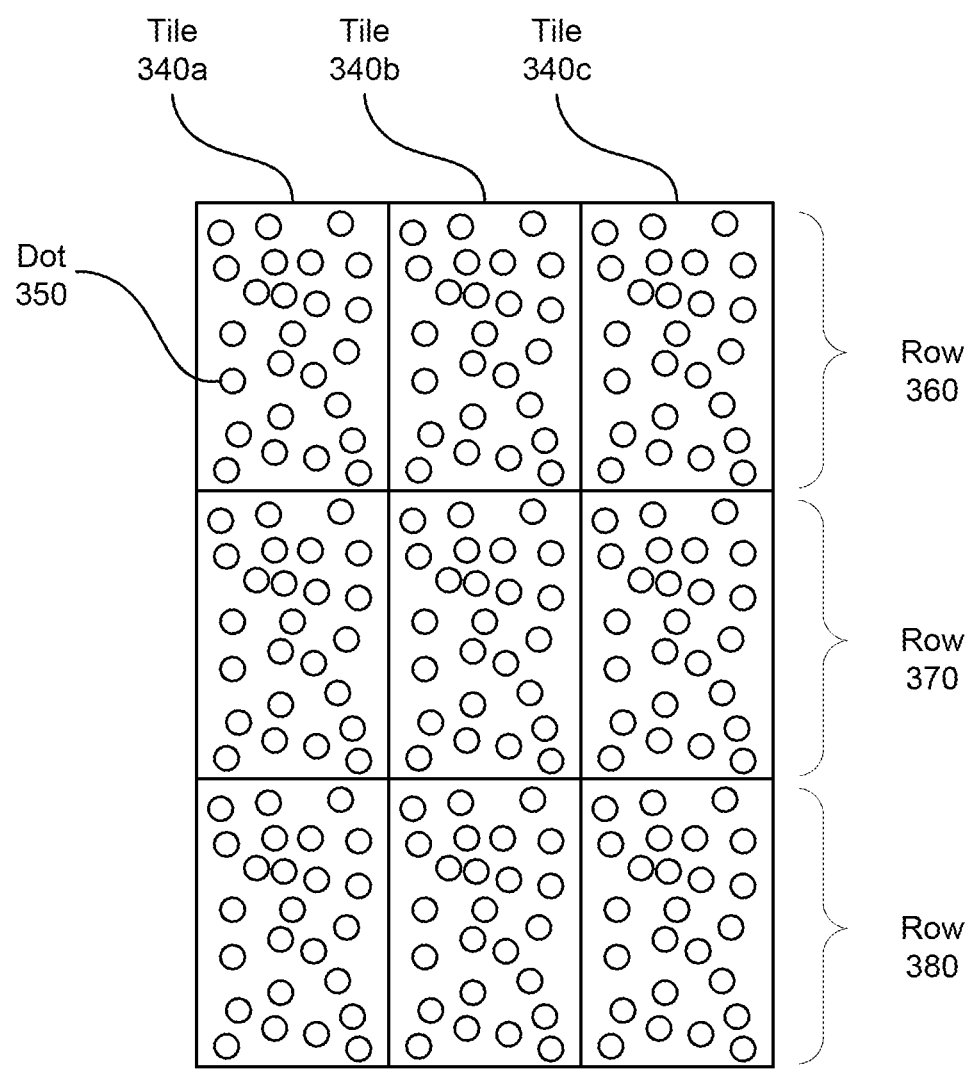
FIG. 3B is an example of a structured light pattern, in accordance with one or more embodiments.

FIG. 3B is an example of a structured light pattern according to one or more embodiments. The structured light projector 300 of FIG. 3A generates a dot pattern comprising a plurality of dots 350, of a plurality of dot patterns, in accordance with instructions from a controller of a depth camera assembly (not shown).

In the illustrated example, the projection assembly 330 replicates the conditioned light (dot pattern) to form a n×M tile pattern in the local area, where each tile comprises the dot pattern, and n and M are integers. In some embodiments, all of the instances have the same dot pattern (e.g., as illustrated). In other embodiments, the projection assembly may generate one or more tiles that have a dot pattern that is different from at least one other tile. For example, a row 360 of tiles including tiles 340a, 340b, and 340c may receive beams from emitters on a first subset of the traces, a row 370 of tiles may receive beams from emitters on a second subset of the traces, and a row 380 of tiles may receive beams from emitters on a third subset of the traces. For example, the VCSEL chip may generate a first dot pattern that is projected into a particular portion (e.g., that would be occupied by row 360) of the local area using a scanning mirror, and then produce a second dot pattern that is projected into a different portion (e.g., that would be occupied by row 370) of the local area using a scanning mirror.

In another example, a density of the dot pattern for each tile may be dependent on instructions from the DCA. For example, the DCA may instruct the structured light projector 300 to provide a particular density pattern based on how far objects are located away from the DCA. For example, a portion of the local area that is closer to a user (e.g., user's hands) may have tiles with a dot pattern density that is lower than a portion of the local area that is far from the user (e.g., 20 feet away).

As mentioned, each trace can be made to have a unique intensity by setting, for example, different numbers of emitters in each trace. Other methods can include driving each trace with a different current or a different operating pulse width. The result is a tile with a unique pattern of dot density or dot intensities. In some embodiments, the tile can then be projected into the local area.

Figure 4A:
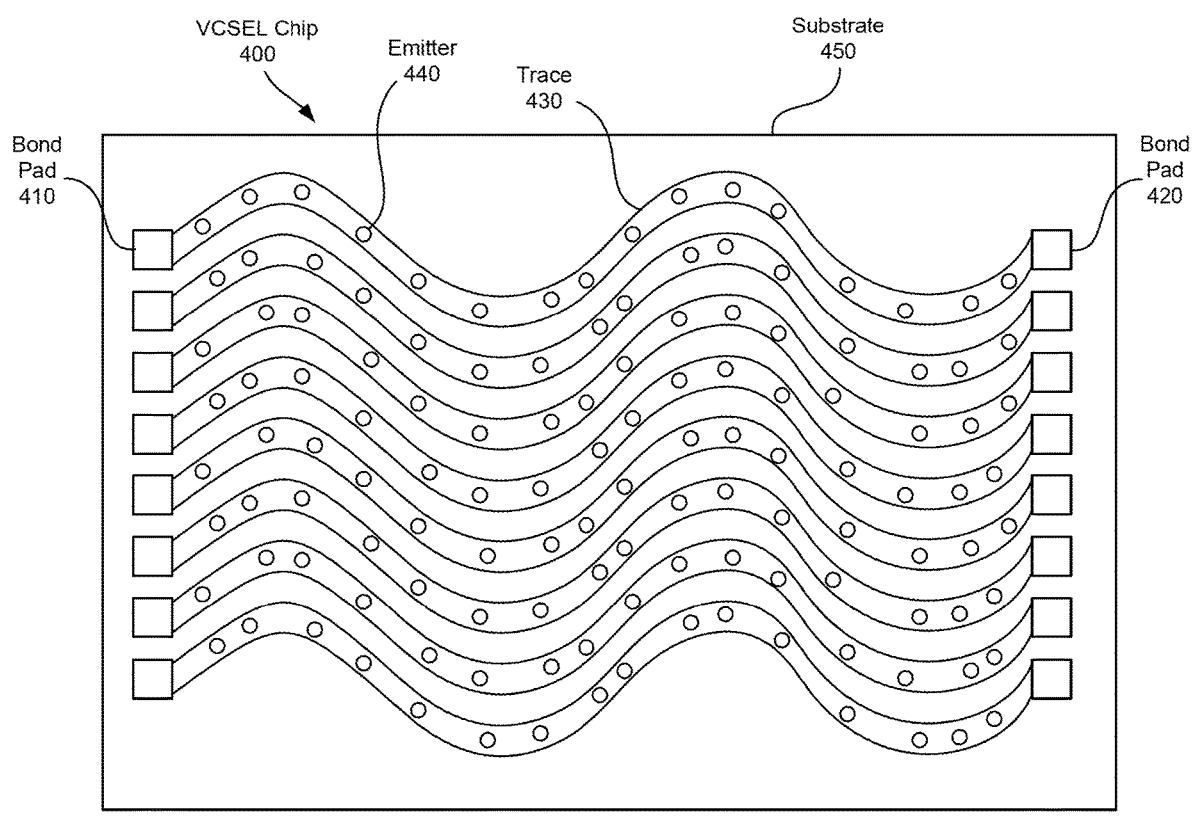
FIG. 4A is a plan view of a VCSEL chip having sinusoidal traces, in accordance with one or more embodiments.

FIG. 4A is a plan view of a VCSEL chip 400 according to one or more embodiments. The VCSEL chip is an example of the VCSEL array. The VCSEL chip 400 may comprise a plurality of bond pads 410, 420, a plurality of traces 430, and a plurality of emitters 400 deposited on a substrate 450. The VCSEL chip 400 may be a component of the structured light projector 210 of FIG. 2.

A first series of bond pads 410 and a second series of bond pads 420 provide coupling locations between the substrate 450 and the plurality of traces 430. A voltage differential may be applied between the first series of bond pads 410 and the second series of bond pads 420, causing current to flow between electrically connected bond pads. The voltage differentials may be selectively applied individually to each pair of connected bond pads. Thus, the components connected to each pair of connected bond pads may be individually controllable. In some embodiments, each trace 430 may be coupled to the substrate 450 via a single bond pad in order to reduce the footprint of the substrate.

The plurality of traces 430 provides an electrical connection from a bond pad in the first series of bond pads 410 to a bond pad in the second series of bond pads 420. The trace 430 may comprise an electrically conductive material (e.g., copper, gold, etc.) deposited on the substrate 450. In some embodiments, two or more traces may be connected in parallel. In some embodiments, a trace 430 may comprise a straight line between two bond pads. In some embodiments, at least a portion of a trace 430 may comprise a change in direction, such as a curve or angle, such that the trace 430 is not a complete straight line between the bond pads connected by the trace. The trace 430 may have a width of approximately 15 microns, or in some embodiments between 5 microns-30 microns. As illustrated in FIG. 4A, each trace 430 is in the general shape of a sinusoidal wave. The shape of the traces 430 provide for uniform emitter coverage on the VCSEL chip 400.

In some embodiments, all the traces 430 on the VCSEL chip 400 may be coplanar. The traces 430 may be deposited in a single process, and the traces 430 may be separated by a separation distance, such as at least 5 microns, to prevent electrical communication between adjacent traces.

The plurality of emitters 440 are each VCSELs. Each emitter 440 may generate a beam of light which provides one or more dots in a structured light pattern. Each trace 430 may comprise a plurality of emitters 440 conductively coupled to the trace 430, referred to as a group of emitters 440. As illustrated, each trace 430 comprises approximately 16 emitters 440. However, traces 430 may comprise any suitable number of emitters 440, such as between 5 and 15 emitters 440, between 1 and 30 emitters 440, or greater than 30 emitters 440. The number of emitters 440 on a single trace 430 may be limited by a minimum pitch distance between emitters 440 which maintains the ability of the emitters 440 to emit a discrete beam of light which is separate from adjacent emitters 440. Each emitter 440 may be approximately 5 microns in diameter, or between 2 microns-10 microns in diameter. An emitter 440 with a 5 micron diameter may provide a good single mode/gaussian shape dot, with a relatively narrow beam divergence and a suitable dot power consumption. In some embodiments, a minimum pitch distance between emitters 440 on different traces 430 may be approximately 25 microns, or at least 20 microns. A minimum pitch distance between emitters 440 on the same trace 430 may be approximately 20 microns, or at least 15 microns. In some embodiments the plurality of emitters 440 are all of a same type (e.g., emit at a same wavelength). In some embodiments, the plurality of emitters 440 includes at least one emitter 440 that is of a different type from another emitter 440 (e.g., emit at two different wavelengths). In some embodiments, all of the emitters 440 in a group are of a same type. In other embodiments, at least one emitter 440 in a group is of a different type than another emitter 440 within the group.

In some embodiments each trace 430 comprises the same number of operational emitters, but varies a driving current for each group. Accordingly, some dots from one group may have a higher intensity than dots in a different group. And in some embodiments, intensity of emitters 440 within a single group may be different from one another. For example, power reduction circuits may be user before one or more emitters within a group of emitters 440. A power reduction circuit reduces an amount of power provided to a particular emitter 440.

In a further alternative, different traces 430 on the VCSEL chip 400 are of different length, thus having different numbers of emitters 440 in order to achieve different intensities. In some embodiments, the spacing between emitters 440 is even within a group and/or a plurality of groups (in some cases all groups). Alternatively, a spacing between emitters 440 on a trace 430 may vary within a group and/or a plurality of groups (in some cases all groups).

In some embodiments, the emitters 440 on a single trace 430 are not collinear. As shown, the traces 430 are curved, and the multiple emitters 440 are located at different positions along the curved traces 430. The emitters 440 on a single trace 430 may be controlled as a group by controlling the voltage differential between the bond pads 410, 420 connected to the trace 430. Thus, each group of emitters 440 may be individually addressable. By controlling the non-collinear emitters 440 as a group, a greater variety of addressable dot patterns may be generated versus using groups of collinear emitters. In contrast to straight traces, which may be used for a grid or line pattern, the curved traces 430 may be used to generate dots in a random pattern, as the emitters 440 may be placed at any desired locations along the curved traces 430. Some applications may benefit from the ability to create a structured light pattern of random or semi-random dots.

Figure 4B:
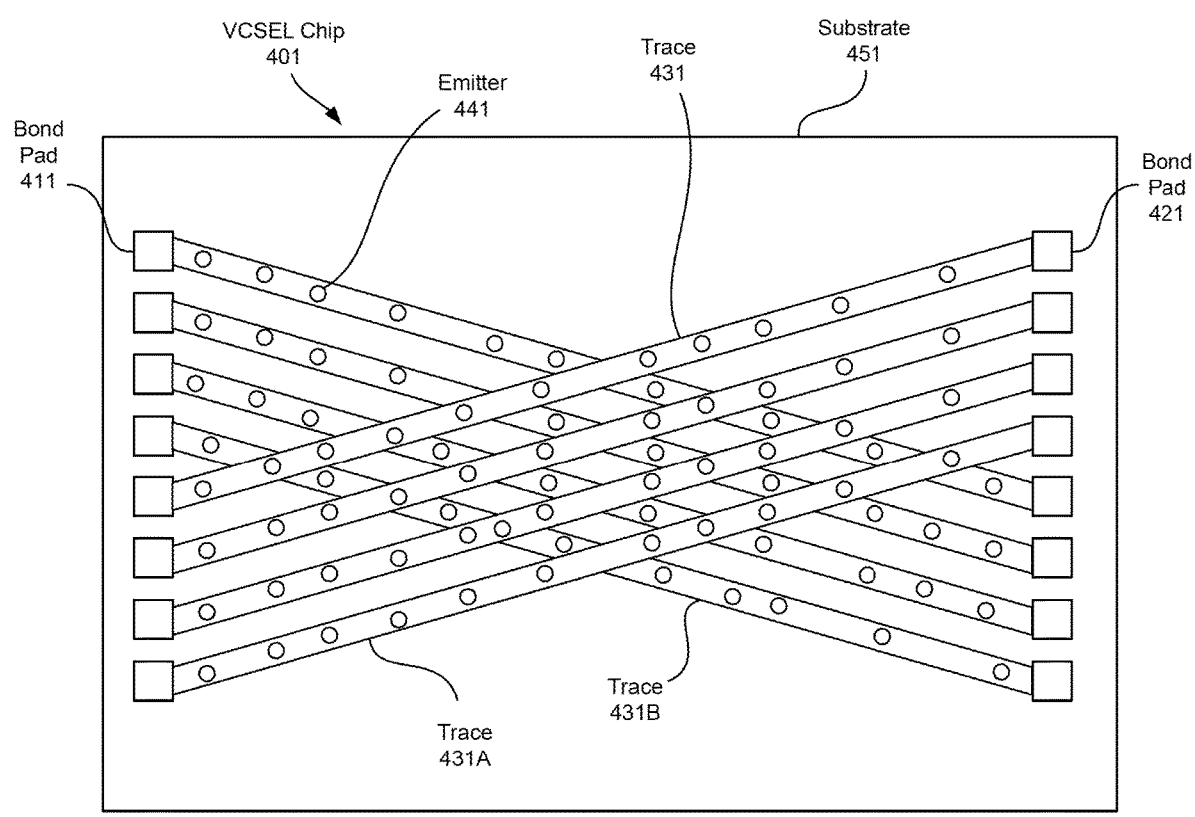
FIG. 4B is a plan view of a VCSEL chip having overlapping traces, in accordance with one or more embodiments.

FIG. 4B is a plan view of a VCSEL chip 401 with overlapping traces in accordance with one or more embodiments. The VCSEL chip 401 comprises a first series of bond pads 411 connected to a second series of bond pads 421 by a plurality of traces 431. A plurality of emitters 441 are electrically coupled to the traces 431. The traces 431 are deposited on a substrate 451. Each trace 431 may be a straight line from a bond pad 411 to a bond pad 421. However, in some embodiments one or more of the traces 431 may have curves or angles.

In some embodiments, at least one trace may overlap at least one other trace. For example, trace 431A overlaps traces 431B, such that at least a portion of trace 431B is located between a portion of trace 431A and the substrate 451. The traces 431A, 431B may be created in different planes. To prevent electrical communication between overlapping traces, the traces may be deposited in different layers. For example, a first trace 431B may be deposited, a dielectric layer may be deposited over the first trace 431B, and a second trace 431A may be deposited on the dielectric layer. Thus, the second trace 431A may overlap the first trace 431B, and the dielectric layer may prevent electrical communication between the first trace and the second trace. In some embodiments, the dielectric layer may be transparent such that light emitted by the emitters passes through the dielectric layer. In some embodiments, the dielectric layer may be partially opaque, such that a portion of the light emitted by the emitters is obscured by the dielectric layer. Thus, the emitters located under the dielectric layer emitting light at the same intensity as the emitters located over the dielectric layer may generate dots of lesser intensity in the structured light pattern. Overlapping traces may provide the ability to generate a greater variety of dot patterns.

Figure 4C:
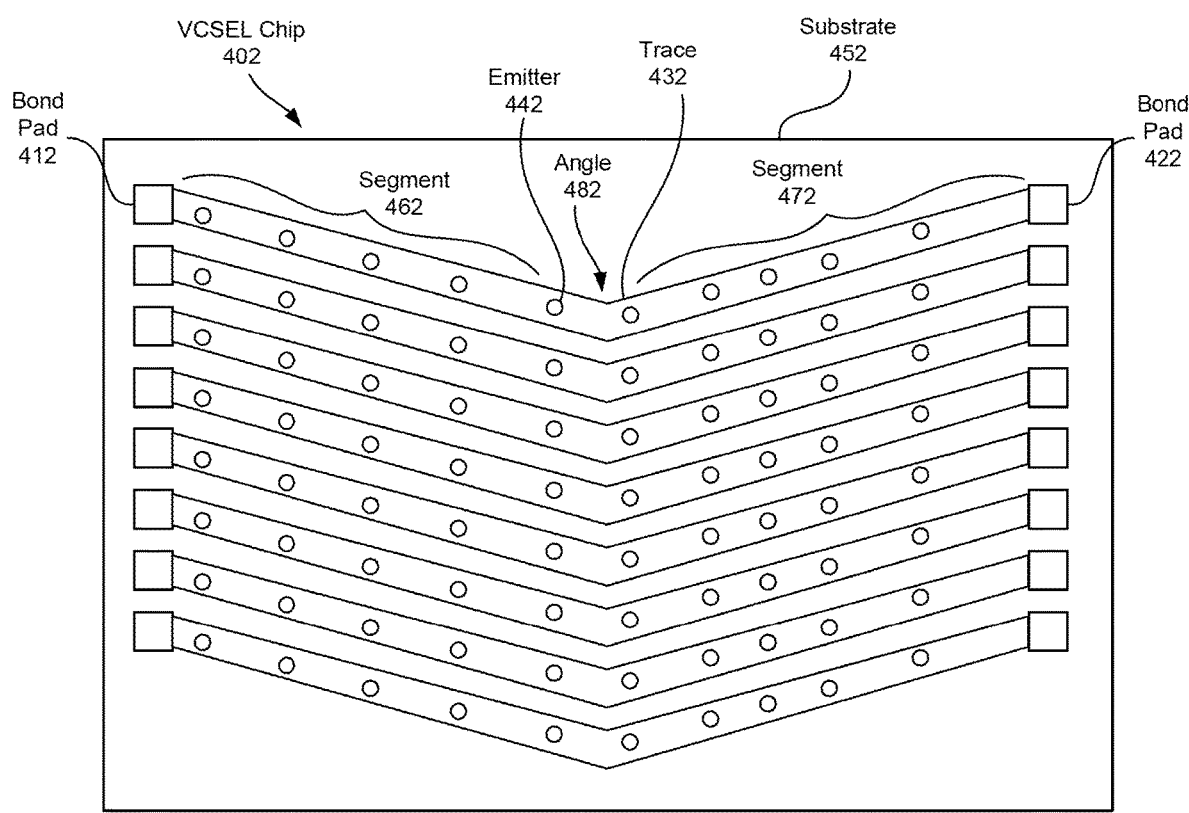
FIG. 4C is a plan view of a VCSEL chip having angled traces, in accordance with one or more embodiments.

FIG. 4C is a plan view of a VCSEL chip 402 with angled traces in accordance with one or more embodiments. The VCSEL chip 402 comprises a first series of bond pads 412 connected to a second series of bond pads 422 by a plurality of traces 432. A plurality of emitters 442 are electrically coupled to the traces 432. The traces 432 are deposited on a substrate 452. Each trace 431 may comprise a plurality of straight line segments from a bond pad 411 to a bond pad 421. For example, as shown the trace 432 comprises a first straight segment 462 and a second straight segment 472 which intersect at an angle 482. The angle 482 may range from greater than 0° to less than 180°. Although shown with two segments, the traces 432 may comprise any suitable number of straight line segments or curved segments. Angled traces may provide the ability to generate a greater variety of dot patterns.

Any combination of the above embodiments may also be provided for achieving dots of varying intensity. A reason for combining the embodiments is to provide a residual level of intensity difference with the further option of increasing the intensity difference when the region being illuminated demands a greater contrast, a better ambiguity, or a better ability to detect a projected dot pattern.

FIG. 5 is a flowchart of a process 500 for generating a structured light pattern in accordance with one or more embodiments. The process shown in FIG. 5 may be performed by components of a DCA (e.g., DCA 200). Other entities may perform some or all of the steps in FIG. 5 in other embodiments. Embodiments may include different and/or additional steps, or perform the steps in different orders.

The DCA controller selects 510 a first dot pattern, of a plurality of dot patterns, based in part on a target density and a target distance, wherein the first dot pattern is associated with a subset of traces of a plurality of traces on a chip, and each respective trace is conductively coupled to a respective group of VCSELs on the chip. The first dot pattern may be selected based on a distance to an object, based on a calculated texture in a local area, manually input, or selected by any other suitable process. In some embodiments, the distance may be a previously known distance. In some embodiments, the distance to the object may be measured by the depth measurement module.

The DCA controller may initially activate all groups of emitters to create a dense dot pattern over the field of view of the camera assembly. The depth measurement module may measure the distance to objects within the field of view. Based on the distance, object size, etc., the DCA controller may determine a target density for the first dot pattern.

The DCA controller activates 520 at least one group of VCSELs that are conductively coupled via the first subset of traces, such that the activated at least one group of VCSELs emit light that forms a first dot pattern. Activating the groups of VCSELs may cause the emitters coupled to the traces to emit light, or to increase an amount of light emitted by the emitters.

The structured light projector projects 530 the first dot pattern into the local area, wherein the first dot pattern has the target density at the target distance. A first portion of the first dot pattern may be projected by a first group of dot emitters, and a second portion of the first dot pattern may be projected by a second group of dot emitters. In some embodiments, the first portion of the first dot pattern may be a first tile of the first dot pattern, and the second portion of the first dot pattern may be a second tile of the first dot pattern. However, in some embodiments, the first portion of the first dot pattern may be a first plurality of dots in the first dot pattern, and the second portion of the first dot pattern may be a second plurality of dots in the first dot pattern. The first plurality of dots and the second plurality of dots may both be projected into a first tile of the first dot pattern.

The DCA controller may select a second dot pattern. The second dot pattern may be less dense than the first pattern density. For example, the DCA controller may determine that a distance to an object has decreased, and thus a lesser dot density may be desirable. In some embodiment, the second pattern density may be greater than the first pattern density. The structured light projector may project the second dot pattern with the second pattern density.

Figure 6:
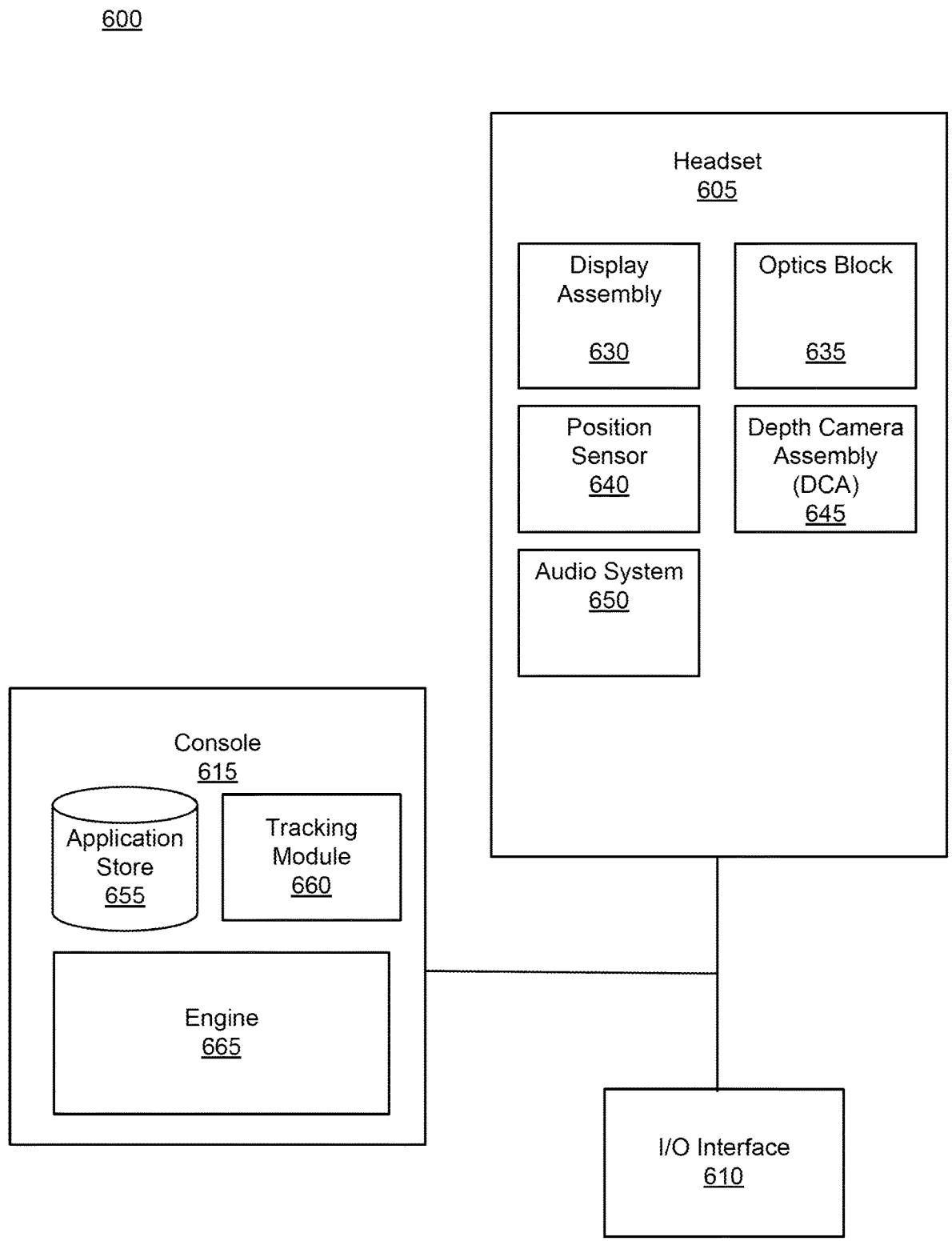
FIG. 6 is a system that includes a headset, in accordance with one or more embodiments.

FIG. 6 is a system 600 that includes a headset 605, in accordance with one or more embodiments. In some embodiments, the headset 605 may be the headset 100 of FIG. 1A or the headset 105 of FIG. 1B. The system 600 may operate in an artificial reality environment (e.g., a virtual reality environment, an augmented reality environment, a mixed reality environment, or some combination thereof). The system 600 shown by FIG. 6 includes the headset 605, an input/output (I/O) interface 610 that is coupled to a console 615. While FIG. 6 shows an example system 600 including one headset 605 and one I/O interface 610, in other embodiments any number of these components may be included in the system 600. For example, there may be multiple headsets each having an associated I/O interface 610, with each headset and I/O interface 610 communicating with the console 615. In alternative configurations, different and/or additional components may be included in the system 600. Additionally, functionality described in conjunction with one or more of the components shown in FIG. 6 may be distributed among the components in a different manner than described in conjunction with FIG. 6 in some embodiments. For example, some or all of the functionality of the console 615 may be provided by the headset 605.

The headset 605 includes the display assembly 630, an optics block 635, one or more position sensors 640, and the DCA 645. Some embodiments of headset 605 have different components than those described in conjunction with FIG. 6. Additionally, the functionality provided by various components described in conjunction with FIG. 6 may be differently distributed among the components of the headset 605 in other embodiments, or be captured in separate assemblies remote from the headset 605.

The display assembly 630 displays content to the user in accordance with data received from the console 615. The display assembly 630 displays the content using one or more display elements (e.g., the display elements 120). A display element may be, e.g., an electronic display. In one or more embodiments, the display assembly 630 comprises a single display element or multiple display elements (e.g., a display for each eye of a user). Examples of an electronic display include: a liquid crystal display (LCD), an organic light emitting diode (OLED) display, an active-matrix organic light-emitting diode display (AMOLED), a waveguide display, some other display, or some combination thereof. Note in some embodiments, the display element 120 may also include some or all of the functionality of the optics block 635.

The optics block 635 may magnify image light received from the electronic display, corrects optical errors associated with the image light, and presents the corrected image light to one or both eyeboxes of the headset 605. In one or more embodiments, the optics block 635 includes one or more optical elements. Example optical elements included in the optics block 635 include: an aperture, a Fresnel lens, a convex lens, a concave lens, a filter, a reflecting surface, or any other suitable optical element that affects image light. Moreover, the optics block 635 may include combinations of different optical elements. In some embodiments, one or more of the optical elements in the optics block 635 may have one or more coatings, such as partially reflective or anti-reflective coatings.

Magnification and focusing of the image light by the optics block 635 allows the electronic display to be physically smaller, weigh less, and consume less power than larger displays. Additionally, magnification may increase the field of view of the content presented by the electronic display. For example, the field of view of the displayed content is such that the displayed content is presented using almost all (e.g., approximately 110 degrees diagonal), and in some cases all, of the user's field of view. Additionally, in some embodiments, the amount of magnification may be adjusted by adding or removing optical elements.

In some embodiments, the optics block 635 may be designed to correct one or more types of optical error. Examples of optical error include barrel or pincushion distortion, longitudinal chromatic aberrations, or transverse chromatic aberrations. Other types of optical errors may further include spherical aberrations, chromatic aberrations, or errors due to the lens field curvature, astigmatisms, or any other type of optical error. In some embodiments, content provided to the electronic display for display is pre-distorted, and the optics block 635 corrects the distortion when it receives image light from the electronic display generated based on the content.

The position sensor 640 is an electronic device that generates data indicating a position of the headset 605. The position sensor 640 generates one or more measurement signals in response to motion of the headset 605. The position sensor 190 is an embodiment of the position sensor 640. Examples of a position sensor 640 include: one or more IMUS, one or more accelerometers, one or more gyroscopes, one or more magnetometers, another suitable type of sensor that detects motion, or some combination thereof. The position sensor 640 may include multiple accelerometers to measure translational motion (forward/back, up/down, left/right) and multiple gyroscopes to measure rotational motion (e.g., pitch, yaw, roll). In some embodiments, an IMU rapidly samples the measurement signals and calculates the estimated position of the headset 605 from the sampled data. For example, the IMU integrates the measurement signals received from the accelerometers over time to estimate a velocity vector and integrates the velocity vector over time to determine an estimated position of a reference point on the headset 605. The reference point is a point that may be used to describe the position of the headset 605. While the reference point may generally be defined as a point in space, however, in practice the reference point is defined as a point within the headset 605.

The DCA 645 generates depth information for a portion of the local area. The DCA includes one or more imaging devices and a DCA controller. The DCA 645 may also include a structured light projector. The DCA 200 of FIG. 2 may be an embodiment of the DCA 645.

The structured light projector comprises at least one VCSEL chip. A VCSEL emits a plurality of different dot patterns. The VCSEL chip includes a plurality of traces. A trace includes a plurality of emitters that have an arrangement on the VCSEL chip (such as sinusoidal arrangement, a pseudo random arrangement, etc.). The arrangement is such that when a trace is active, the plurality of emitters emit a dot pattern that has a spatial distribution that corresponds to the arrangement of the plurality of emitters. In some embodiments, the arrangement may be the same for different traces. Alternatively, the arrangement may be different between at least one trace and one other trace on the VCSEL chip. In some embodiments, the arrangement is different for each of the traces. Each emitter may emit a beam of light resulting in a dot. The particular arrangement is such that light emitted from the plurality of emitters for a trace forms a corresponding dot pattern in the local area. Each trace may be individually addressable. Thus, different dot patterns may be generating by activating different traces on the VCSEL chip. In circumstances where a high-density dot pattern is desirable, such as for depth-sensing at long ranges, the DCA controller 150 may activate all traces on the VCSEL chip. In circumstances where a low-density dot pattern is desirable, such as for depth sensing at short ranges, the DCA controller may activate a subset of the traces on the VCSEL chip. Operation and structure of the DCA 645 and the VCSEL chips are discussed in greater detail with respect to FIG. 2-FIG. 5.

The audio system 650 provides audio content to a user of the headset 605. The audio system 650 may comprise one or acoustic sensors, one or more transducers, and an audio controller. The audio system 650 may provide spatialized audio content to the user. The audio system 650 may provide information describing at least a portion of the local area from e.g., the DCA 645 and/or location information for the headset 605 from the position sensor 640. The audio system 650 may generate one or more sound filters, and use the sound filters to provide audio content to the user.

The I/O interface 610 is a device that allows a user to send action requests and receive responses from the console 615.

An action request is a request to perform a particular action. For example, an action request may be an instruction to start or end capture of image or video data, or an instruction to perform a particular action within an application. The I/O interface 610 may include one or more input devices. Example input devices include: a keyboard, a mouse, a game controller, or any other suitable device for receiving action requests and communicating the action requests to the console 615. An action request received by the I/O interface 610 is communicated to the console 615, which performs an action corresponding to the action request. In some embodiments, the I/O interface 610 includes an IMU that captures calibration data indicating an estimated position of the I/O interface 610 relative to an initial position of the I/O interface 610. In some embodiments, the I/O interface 610 may provide haptic feedback to the user in accordance with instructions received from the console 615. For example, haptic feedback is provided when an action request is received, or the console 615 communicates instructions to the I/O interface 610 causing the I/O interface 610 to generate haptic feedback when the console 615 performs an action.

The console 615 provides content to the headset 605 for processing in accordance with information received from one or more of: the DCA 645, the headset 605, and the I/O interface 610. In the example shown in FIG. 6, the console 615 includes an application store 655, a tracking module 660, and an engine 665. Some embodiments of the console 615 have different modules or components than those described in conjunction with FIG. 6. Similarly, the functions further described below may be distributed among components of the console 615 in a different manner than described in conjunction with FIG. 6. In some embodiments, the functionality discussed herein with respect to the console 615 may be implemented in the headset 605, or a remote system.

The application store 655 stores one or more applications for execution by the console 615. An application is a group of instructions, that when executed by a processor, generates content for presentation to the user. Content generated by an application may be in response to inputs received from the user via movement of the headset 605 or the I/O interface 610. Examples of applications include: gaming applications, conferencing applications, video playback applications, or other suitable applications.

The tracking module 660 tracks movements of the headset 605 or of the I/O interface 610 using information from the DCA 645, the one or more position sensors 640, or some combination thereof. For example, the tracking module 660 determines a position of a reference point of the headset 605 in a mapping of a local area based on information from the headset 605. The tracking module 660 may also determine positions of an object or virtual object. Additionally, in some embodiments, the tracking module 660 may use portions of data indicating a position of the headset 605 from the position sensor 640 as well as representations of the local area from the DCA 645 to predict a future location of the headset 605. The tracking module 660 provides the estimated or predicted future position of the headset 605 or the I/O interface 610 to the engine 665.

The engine 665 executes applications and receives position information, acceleration information, velocity information, predicted future positions, or some combination thereof, of the headset 605 from the tracking module 660. Based on the received information, the engine 665 determines content to provide to the headset 605 for presentation to the user. For example, if the received information indicates that the user has looked to the left, the engine 665 generates content for the headset 605 that mirrors the user's movement in a virtual local area or in a local area augmenting the local area with additional content. Additionally, the engine 665 performs an action within an application executing on the console 615 in response to an action request received from the I/O interface 610 and provides feedback to the user that the action was performed. The provided feedback may be visual or audible feedback via the headset 605 or haptic feedback via the I/O interface 610.

Additional Configuration Information

The foregoing description of the embodiments has been presented for illustration; it is not intended to be exhaustive or to limit the patent rights to the precise forms disclosed. Persons skilled in the relevant art can appreciate that many modifications and variations are possible considering the above disclosure.

Some portions of this description describe the embodiments in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all the steps, operations, or processes described.

Embodiments may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A vertical cavity surface emitting laser (VCSEL) array comprising:
   a plurality of groups of VCSELs on a single VCSEL chip, where each group of VCSELs forms a different dot pattern; and
   a plurality of traces, where each trace conductively couples to a respective group of VCSELs such that each group of VCSELs is individually addressable,
      wherein a first trace in the plurality of traces comprises a sinusoidal shape.

2. The VCSEL array of claim 1, wherein each of the plurality of traces comprises a sinusoidal shape.

3. The VCSEL array of claim 1, wherein a group of VCSELs, of the plurality of groups of VCSELs, is individually addressable by changing a voltage differential between a first bond pad and a second bond pad coupled to a trace that electrically connects the group of VCSELs to the first bond pad and the second bond pad.

4. The VCSEL array of claim 1, further comprising a projection assembly configured to project light emitted by the plurality of groups of VCSELs into a plurality of tiles.

5. The VCSEL array of claim 1, further comprising a dielectric layer deposited between a first plane comprising the first trace in the plurality of traces and a second plane comprising a second trace in the plurality of traces.

6. The VCSEL array of claim 1, wherein the first trace in the plurality of traces overlaps a second trace in the plurality of traces.

7. The VCSEL array of claim 1, wherein a second trace in the plurality of traces comprises a first straight segment and a second straight segment, and the first straight segment and the second straight segment join together at an angle greater than 0 degrees and less than 180 degrees.

8. A structured light projector comprising:
   a first group of emitters conductively coupled to a first trace, wherein the first trace comprises a sinusoidal shape; and
   a second group of emitters conductively coupled to a second trace, wherein the first group of emitters and the second group of emitters are individually addressable.

9. The structured light projector of claim 8, further comprising:
   a first bond pad and a second bond pad coupled to the first trace, wherein the first group of emitters is individually addressable by changing a voltage differential between the first bond pad and the second bond pad; and
   a third bond pad and a fourth bond pad coupled to the second trace, wherein the second group of emitters is individually addressable by changing a voltage differential between the third bond pad and the fourth bond pad.

10. The structured light projector of claim 8, further comprising a projection assembly configured to project light emitted by the emitters into a plurality of tiles.

11. The structured light projector of claim 10, wherein the projection assembly projects light from the first group of emitters into a first tile, and wherein the projection assembly projects light from the second group of emitters into a second tile.

12. The structured light projector of claim 9, wherein the projection assembly projects light from the first group of emitters and the second group of emitters into a first tile.

13. The structured light projector of claim 8, wherein the second trace comprises a sinusoidal shape.

14. The structured light projector of claim 8, further comprising a dielectric layer between a first plane comprising the first trace and a second plane comprising the second trace.

15. The structured light projector of claim 14, wherein the second trace overlaps the first trace.

16. A method comprising:
   selecting a first dot pattern, of a plurality of dot patterns, based in part on a target density and a target distance, wherein the first dot pattern is associated with a first subset of sinusoidal traces of a plurality of traces on a chip, and each respective trace is conductively coupled to a respective group of VCSELs on the chip;
   activating at least one group of VCSELs that are conductively coupled via the first subset of sinusoidal traces, such that the activated at least one group of VCSELs emit light that forms a first dot pattern; and
   projecting the first dot pattern into the local area, wherein the first dot pattern has the target density at the target distance.

17. The method of claim 16, wherein the first subset of sinusoidal traces includes at least a first trace and a second trace, and the first trace is conductively coupled to a first group of VCSELs and the second trace is conductively coupled to a second group of VCSELs.

18. The method of claim 16, wherein at least one trace of the plurality of traces is conductively coupled to a group of emitters that is inactive.

19. The method of claim 16, further comprising:
   capturing images of the local area including the first dot pattern;
   determining depth information associated with an object within the local area using the captured images;
   dynamically selecting a dot pattern, of the plurality of dot patterns, based in part on the depth information, wherein the dot pattern is associated with a second subset of traces of the plurality of traces;
   activating one or more groups of VCSELs that are conductively coupled by the second subset of traces, such that the activated one or more groups of VCSELs emit light that forms a second dot pattern; and
   projecting the second dot pattern into the local area, wherein the second dot pattern has a different target density than the first dot pattern.

20. The method of claim 16, wherein the at least one group of VCSELs includes a first VCSEL and a second VCSEL and the first VCSEL and the second VCSEL emit light at different intensities.

* * * * *